US009281611B2

(12) United States Patent
Glick et al.

(10) Patent No.: US 9,281,611 B2
(45) Date of Patent: Mar. 8, 2016

(54) ELECTRIC CONNECTOR WITH WIRE RETAINER TUBE

(71) Applicant: Lear Corporation, Southfield, MI (US)

(72) Inventors: Michael Glick, Farmington Hills, MI (US); Bhupinder Rangi, Novi, MI (US)

(73) Assignee: Lear Corporation, Southfield, MI (US)

( * ) Notice: Subject to any disclaimer, the term of this patent is extended or adjusted under 35 U.S.C. 154(b) by 0 days.

(21) Appl. No.: 14/317,765

(22) Filed: Jun. 27, 2014

(65) Prior Publication Data

US 2015/0079837 A1 Mar. 19, 2015

Related U.S. Application Data

(60) Provisional application No. 61/865,884, filed on Aug. 14, 2013.

(51) Int. Cl.

| | |
|---|---|
| ***H02G 3/22*** | (2006.01) |
| ***H05K 5/02*** | (2006.01) |
| ***H01R 13/52*** | (2006.01) |
| ***H01R 13/58*** | (2006.01) |
| ***H01R 13/585*** | (2006.01) |

(52) U.S. Cl.

CPC ........ *H01R 13/5804* (2013.01); *H01R 13/5205* (2013.01); *H01R 13/585* (2013.01); *H01R 13/5816* (2013.01)

(58) Field of Classification Search

CPC ........... H01R 13/5804; H01R 13/5205; H01R 13/585; H01R 13/5816; H01R 13/5221; H01R 13/5841

USPC .................................. 439/460, 464, 587, 589

See application file for complete search history.

(56) References Cited

U.S. PATENT DOCUMENTS

| | | | | |
|---|---|---|---|---|
| 4,990,102 | A | 2/1991 | Myers | |
| 5,445,538 | A | 8/1995 | Rodrigues et al. | |
| 5,660,566 | A * | 8/1997 | Ohsumi | 439/587 |
| 6,257,914 | B1 | 7/2001 | Comerci et al. | |
| 6,663,415 | B1 | 12/2003 | Wu | |
| 7,621,772 | B1 * | 11/2009 | Tobey | H01R 13/58 174/660 |
| 7,892,018 | B1 * | 2/2011 | Tobey | H01R 24/64 439/441 |
| 7,955,120 | B2 * | 6/2011 | Patel et al. | 439/460 |
| 7,993,170 | B2 * | 8/2011 | Nakata | H01R 4/185 439/587 |
| 8,109,784 | B2 * | 2/2012 | Patel et al. | 439/460 |
| 8,298,000 | B2 * | 10/2012 | Patel et al. | 439/460 |
| 2007/0026735 | A1 * | 2/2007 | Pyron | B60R 16/0222 439/584 |
| 2007/0087621 | A1 * | 4/2007 | Fukushima | H01R 9/0524 439/460 |
| 2007/0240902 | A1 * | 10/2007 | Tapper | H02G 3/088 174/660 |
| 2007/0254525 | A1 * | 11/2007 | Pyron | H02G 3/085 439/584 |
| 2009/0298339 | A1 * | 12/2009 | Wu | 439/607.41 |
| 2010/0285688 | A1 * | 11/2010 | De Bruijn | H01R 9/053 439/460 |
| 2011/0059659 | A1 * | 3/2011 | Matsumoto | H01R 13/426 439/733.1 |
| 2011/0086545 | A1 * | 4/2011 | Ishida | H01R 13/5208 439/587 |
| 2011/0223796 | A1 * | 9/2011 | Reimchen | 439/460 |

(Continued)

FOREIGN PATENT DOCUMENTS

| | | | |
|---|---|---|---|
| EP | 0653811 | A1 | 5/1995 |
| WO | 2011139099 | A1 | 4/2011 |

*Primary Examiner* — Tulsidas C Patel

*Assistant Examiner* — Peter G Leigh

(74) *Attorney, Agent, or Firm* — MacMillan, Sobanski & Todd, LLC

(57) ABSTRACT

An electrical connector has a connector body and a terminal mounted to the connector body. A wire is connected to the terminal, and a retainer tube is mounted to the connector body and engaged with the wire.

28 Claims, 5 Drawing Sheets

(56) References Cited

U.S. PATENT DOCUMENTS

2012/0142207 A1* 6/2012 Duval ................ H01R 13/5205 439/272
2012/0159740 A1* 6/2012 Strelow ................ H02G 3/0658 16/2.2
2012/0184128 A1* 7/2012 Nachbauer et al. ........... 439/460
2012/0225582 A1* 9/2012 Smutny et al. ................ 439/587
2012/0258623 A1* 10/2012 Nawa ............................ 439/587
2013/0017719 A1* 1/2013 Tanaka et al. ................. 439/587
2013/0023146 A1* 1/2013 Andresen ............. H01R 4/2433 439/391
2013/0056262 A1 3/2013 Brodeur et al.
2013/0099452 A1* 4/2013 Hein et al. .................... 277/607
2014/0011400 A1* 1/2014 Shiga ................. H01R 13/5208 439/587

* cited by examiner

ELECTRIC CONNECTOR WITH WIRE RETAINER TUBE

CROSS-REFERENCE TO RELATED APPLICATIONS

This application claims the benefit of U.S. Provisional Application No. 61/865,884, filed Aug. 14, 2013, the disclosure of which is incorporated herein by reference.

BACKGROUND OF THE INVENTION

This invention relates in general to an electric connector. More specifically, this invention relates to an electric connector having improved cable stabilization.

Electric connectors are used to house electric terminals for connection to electric components. Typically, an electric terminal is housed within a connector body, and a wire is welded to the electric terminal. A single connector body may house multiple electric terminals. The electric connector allows for convenient mating of the housed electric terminals with corresponding terminals. Additionally, the electric connector may help protect the electric terminals from dirt, water, and other environmental features. An electric connector may be damaged if it is subject to rough treatment, for example, if excessive pulling force or twisting applied to the wire. It would be advantageous to have an electric connector that is better able to resist damage from such handling.

SUMMARY OF THE INVENTION

This invention relates to an electric connector. The electrical connector has a connector body and a terminal mounted to the connector body. A wire is connected to the terminal, and a retainer tube is mounted to the connector body and engaged with the wire.

In an alternative embodiment of the electric connector, the connector body defines a wire opening that the wire passes through and the retainer tube includes resilient retainer beams that engage the wire. The retainer beams extend radially from the retainer tube toward a retainer tube axis that is coaxial with the wire opening, and also extend axially from a first end of the retainer tube toward a second end of the retainer tube.

Various aspects of this invention will become apparent to those skilled in the art from the following detailed description of the preferred embodiment, when read in light of the accompanying drawings.

DETAILED DESCRIPTION OF THE PREFERRED EMBODIMENT

Figure 1:
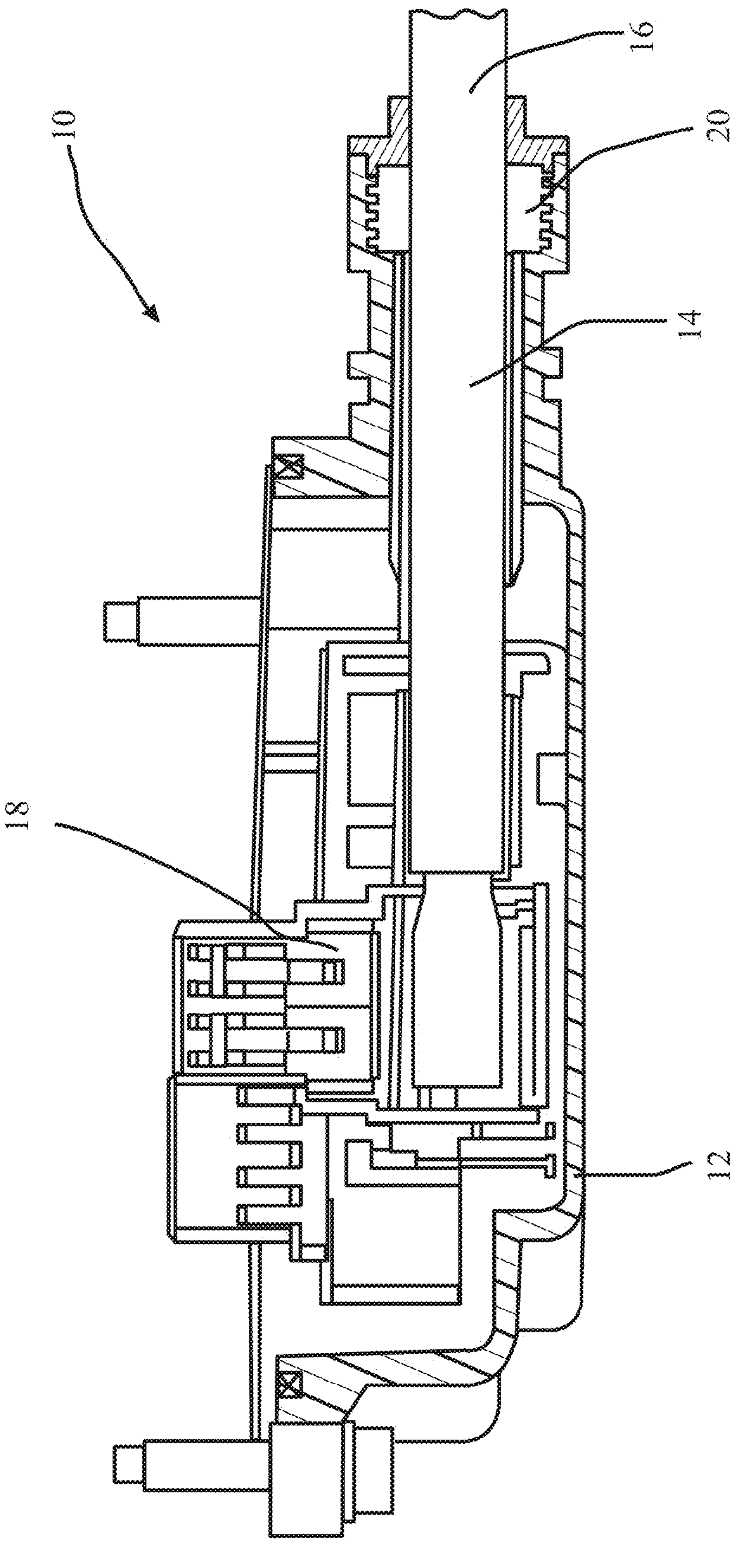
FIG. 1 is a cross-sectional view of a prior art electric connector.

Referring now to the drawings, there is illustrated in FIG. 1 a cross-sectional view of a prior art electric connector, indicated generally at 10. The prior art electric connector 10 includes a connector body 12 and a wire 14. At least a portion of the wire 14 includes an outer layer of insulation 16. The wire 14 is connected to a terminal 18. A seal 20 is provided between the connector body 12 and the outer layer of insulation 16. The prior art electric connector 10 is configured to be mated with a corresponding connector (not shown), so that the terminal 18 will be placed in electric communication with a corresponding terminal (not shown).

Figure 2:
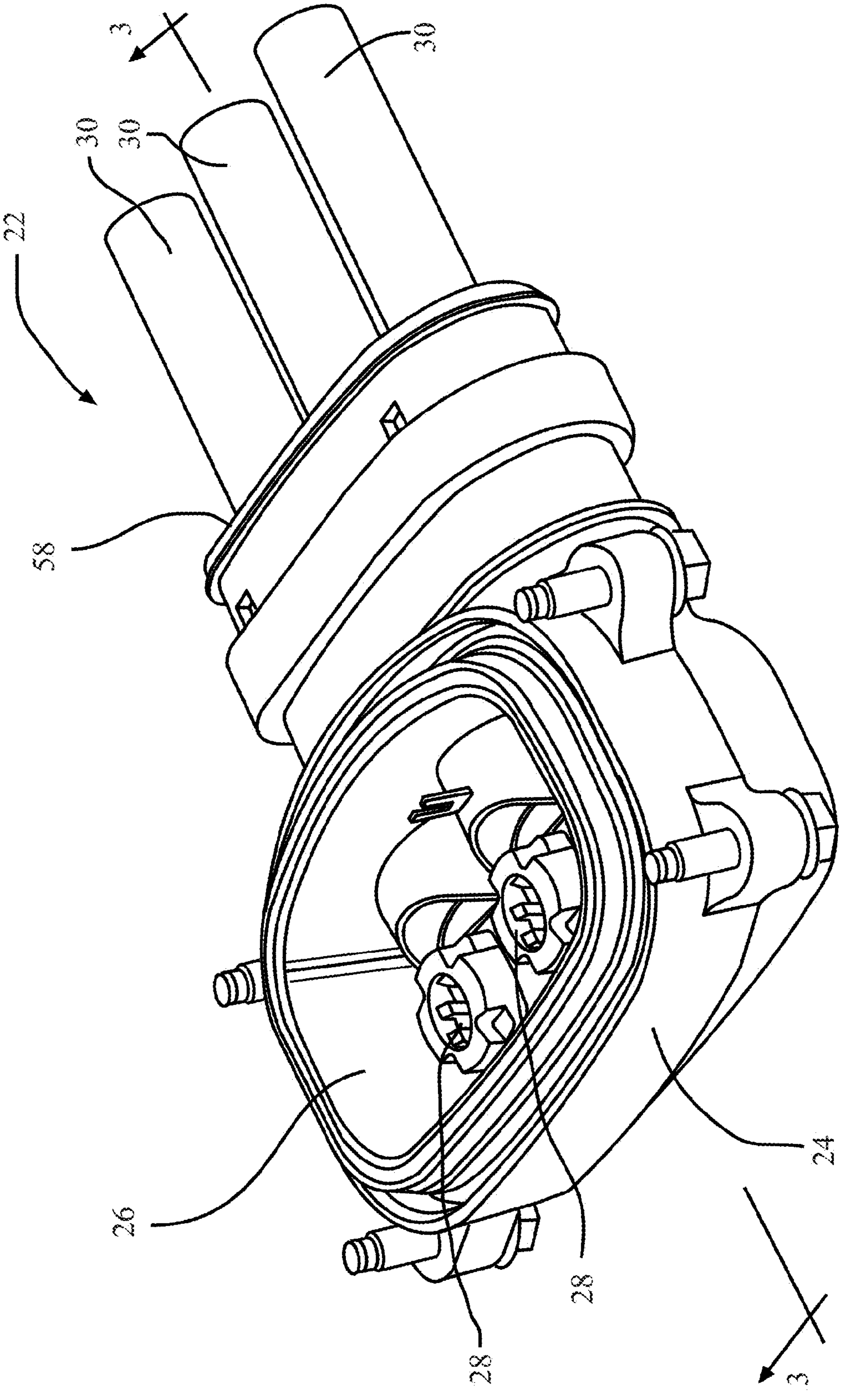
FIG. 2 is a perspective view of an electric connector.

Referring to FIG. 2 there is shown a perspective view of an electric connector, indicated generally at 22. The electric connector 22 includes a connector body 24. The connector body 24 may be made of metal or any other desired material. The electric connector 22 includes a terminal cover 26. The terminal cover 26 may be made of plastic or any other desired material. The terminal cover 26 is provided to help protect terminals 28. The electric connector 22 may include three terminals 28 (two are visible in FIG. 2). Alternatively, the electric connector 22 may include some other number of terminals 28. The terminals 28 may be made out of an electrically-conductive material, such as copper or aluminum, but may be made of any desired material. Each terminal 28 is connected to a wire 30. The electric connector 22 may include three wires 30, one for each terminal 28. Alternatively, the electric connector 22 may include any other number of wires 30.

Figure 3:
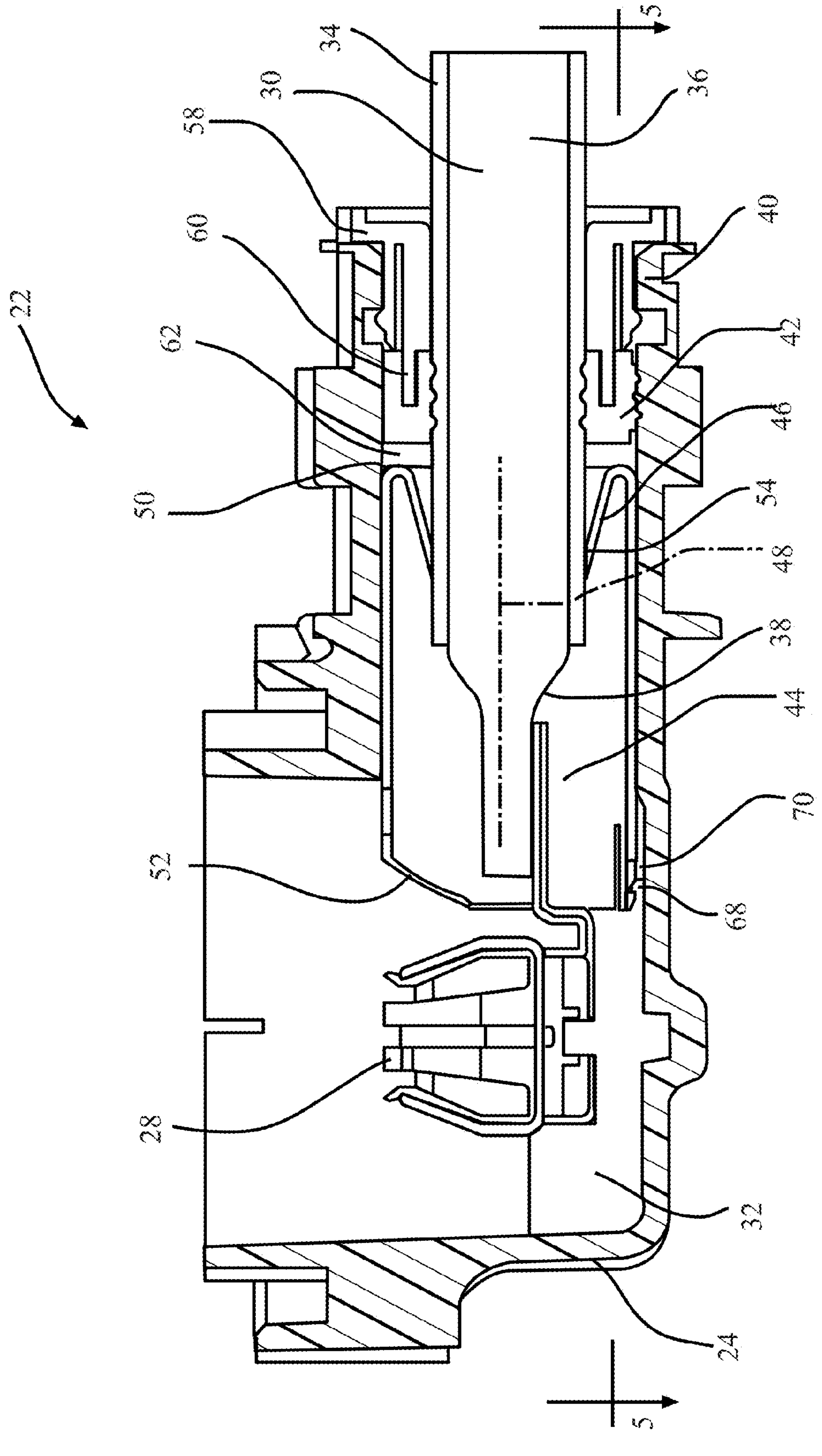
FIG. 3 is a cross-sectional view taken along the line 3-3 of FIG. 2.

Referring to FIG. 3, a cross-sectional view of the electric connector 22 taken along the line 3-3 of FIG. 2 is shown (the terminal cover 26 is not shown in FIG. 3 for clarity). The terminal 28 may be positioned within the connector body 24 by a terminal interface 32 that may be mounted within the connector body 24. The terminal interface 32 may be made of plastic or any other desired material. The terminal interface 32 may serve to mount the electric terminal 28 within the connector body 24. The wire 30 may include a layer of wire insulation 34. The wire insulation 34 may surround a conductive portion 36 of the wire 30. The wire 30 may include an exposed portion 38 where the conductive portion 36 is not surrounded by the wire insulation 34. The exposed portion 38 may be welded or otherwise attached to the terminal 28 to provide electric communication between the terminal 28 and the wire 30. The wire 30 may enter the connector body 24 through a wire opening 40. The wire opening 40 may have a circular cross sectional shape or any other desired shape. A wire seal 42 may be positioned within the wire opening 40 to seal the wire opening 40 against dirt, water, and other contaminants. The wire seal 42 may be a ring seal that is compressed between the wire 30 and the connector body 24.

Figure 4:
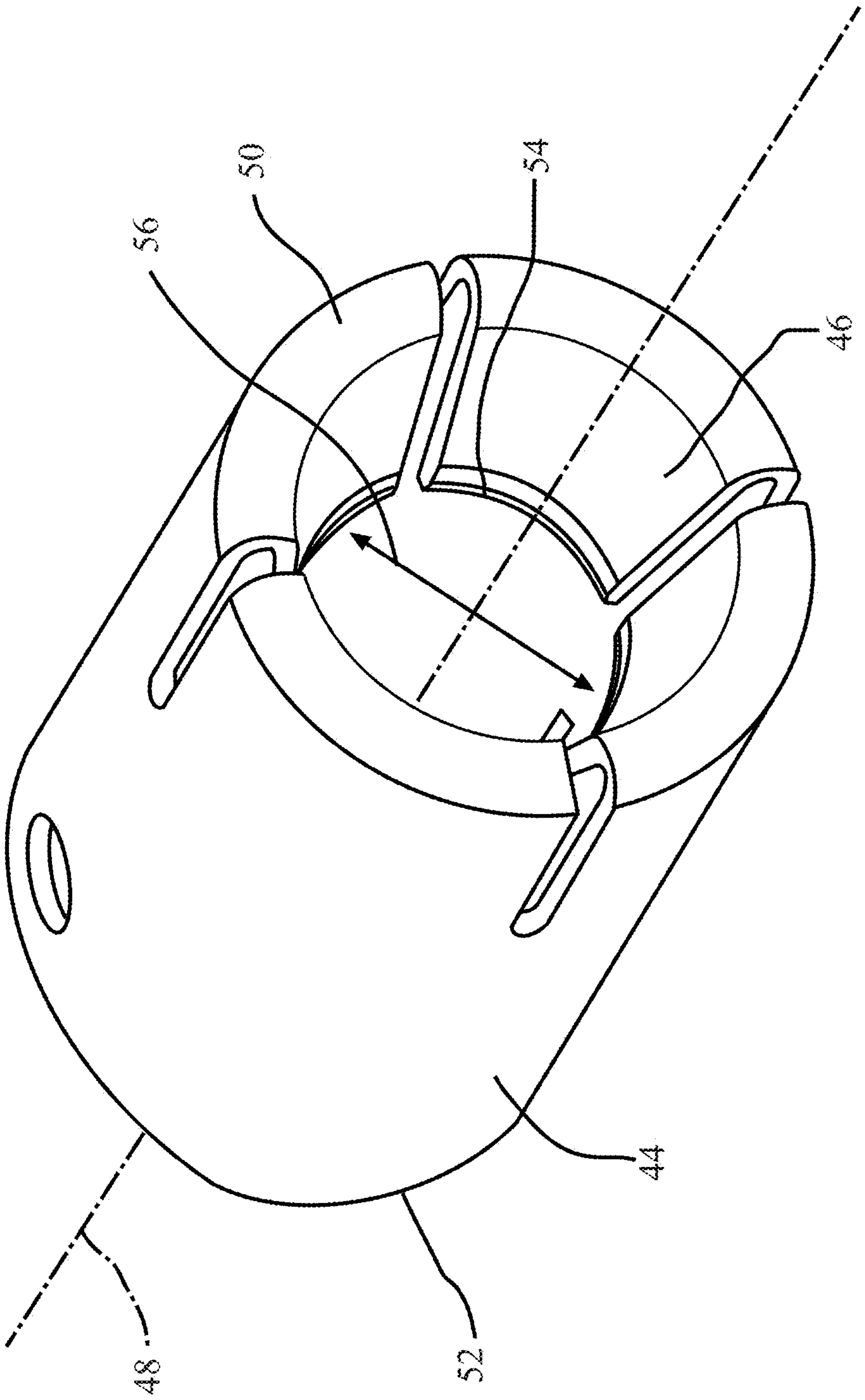
FIG. 4 is a perspective view of a retainer tube included in the electric connector shown in FIG. 2.

The electric connector 22 may include a retainer tube 44. The retainer tube 44 may be made of electrically-insulating plastic or any other desired material. The retainer tube 44 may have a generally cylindrical shape or any other desired shape. The retainer tube 44 may be positioned between the connector body 24 and the wire 30, and may generally surround the exposed portion 38 of the wire 30. As best seen in FIG. 4, the retainer tube 44 may include a plurality of retainer beams 46. The retainer beams 46 may be inwardly-projecting, flexible extensions of the retainer tube 44. The retainer beams 46 may be inwardly-projecting in that they extend radially from the retainer tube 44 toward a retainer tube axis 48 at the center of the retainer tube 44. Additionally, the retainer beams 46 may extend axially from a first end 50 of the retainer tube 44 toward a second end 52 of the retaining tube 44. The retainer beams 46 may include beam ends 54 that may engage the wire insulation 34, as shown in FIG. 3. When the retainer tube 44 is not installed (as shown in FIG. 4), the retainer beams 46 may define an inner diameter 56 that is less than a diameter of the wire 30. When the retainer tube 44 is installed on the wire 30 (as shown in FIG. 3), the retainer beams 46 may be forced outward by the wire 30 so as to apply an inward force against the wire 30. Although the retainer beams 46 have been described as defining the inner diameter 56, it should be appreciated that the retainer beams 46 may define a space that has a shape other than circular, if desired. The retainer beams 46 may apply a force on the wire 30 to keep the wire 30 coaxial with the wire opening 40. It should be appreciated that a force applied to the wire 30 to move it away from the coaxial position would tend to deflect at least one of the retainer beams 46, and the deflected retainer beam 46 would apply a beam force against this deflection.

The retainer tube 44 may help isolate the conductive portion 36 of the wire 30 from the connector body 24 by providing an electrically non-conductive barrier between the connector body 24 and the exposed portion 38 of the wire 30. Additionally, the retainer tube 44 may help maintain the position of the wire 30 relative to the connector body 24 and may retain the wire 30 in a position coaxial with the wire opening 40.

The retainer tube 44 may also provide strain relief for the electric connector 22. It should be appreciated that if the wire 30 is pulled or twisted relative to the connector body 24, this may apply a force that could place strain on the connection between the wire 30 and the terminal 28 or on the connection between the terminal 28 and the terminal interface 32. However, this force may be transferred to the retainer beams 46, thereby relieving strain that may otherwise be transferred to the terminal 28. Additionally, the retainer tube 44 helps to prevent movement of the wire 30 relative to the connector body 24. This helps to reduce possible stress on the wire seal 42 and helps to prevent damage to the wire seal 42 or movement of the wire seal 42 relative to the connector body 24.

The electric connector 22 may include a seal retainer 58. The seal retainer 58 may be made of plastic or any other desired material. The seal retainer 58 may be snapped into the wire opening 40 to help retain the wire seal 42 in place. The seal retainer 58 may include a grip 60 that extends from the seal retainer 58 into the wire opening 40. During assembly of the electric connector 22, the wire seal 42 may be placed on the grip 60 prior to the seal retainer 58 being inserted into the wire opening 40. The wire seal 42 may be made of a resilient material, such as rubber, and may be compressed within a space 62 defined between the wire 30, the connector body 24, and the first end 50 of the retainer tube 44. In the event that the wire seal 42 becomes disengaged from the grip 60, the retainer tube 44 will help maintain the wire seal 42 in the proper position between the connector body 24 and the wire 30 by keeping the wire seal 42 trapped within the space 62.

The connector body 24, the seal retainer 58, and the wire seal 42 may be made of different materials and may respond differently to temperature changes. When the electric connector 22 is heated, the wire seal 42 may expand. If the wire seal 42 is constrained by the connector body 24 and the seal retainer 58, it may expand through the space 62 toward the terminal 28. If the wire seal 42 expands too much, it may no longer apply sufficient pressure to the connector body 24 to maintain an adequate seal. The retainer tube 44 helps prevent this mode of failure by limiting how far the wire seal 42 may expand. If the wire seal 42 expands sufficiently to fill the space 62, it will engage the first end 50 of the retainer tube 44 and will be prevented from expanding further along the wire opening 40. Additional expansion of the wire seal 42 will therefore not cause a loss of pressure applied to the connector body 24. The retainer tube 44 helps to keep the wire seal 42 compressed uniformly during the life of the electric connector 22.

Figure 5:
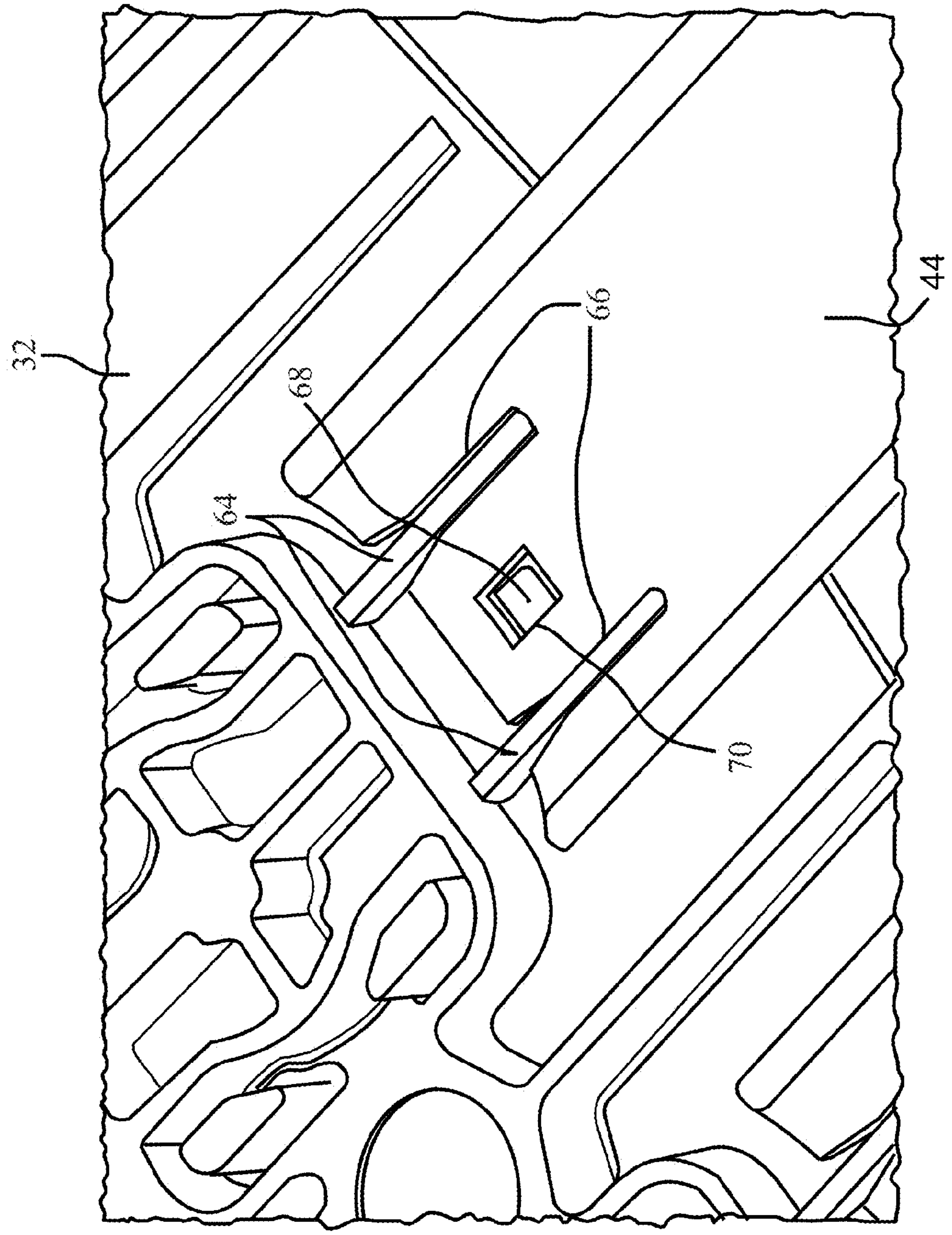
FIG. 5 is a perspective view of the electric connector cut along the line 5-5 of FIG. 3, showing guide and latch features of the retainer tube.

Referring to FIG. 5, it can be seen that the terminal interface 32 may include guides 64 and the retainer tube 44 may include corresponding grooves 66. The guides 64 and the cooperating grooves 66 may serve as a position feature which assists in proper positioning of the retainer tube 44 relative to the connector body 24 during assembly. The position feature assists in proper positioning of the retainer tube 44 by limiting the ability of the retainer tube 44 to be installed in improper positions. The retainer tube 44 may engage the guides 64 and be blocked from being inserted fully into the wire opening 40 if the retainer tube 44 is incorrectly aligned. When the retainer tube 44 is in the proper position relative to the connector body 24, the guides 64 may enter the grooves 66, and the retainer tube 44 may be fully inserted into the wire opening 40. Additionally, the position feature may help prevent over-insertion of the retainer tube 44 into the connector body 24, as the guides 64 engage ends of the grooves 66 to prevent further movement of the retainer tube 44 into the connector body 24. The terminal interface 32 may also include a tab 68 and the retainer tube 44 may include a cooperating slot 70. The tab 68 and the cooperating slot 70 may serve as a tube lock which helps retain the retainer tube 44 in position within the connector body 24. When the retainer tube 44 is properly positioned in the connector body 24, the tab 68 may be located within the slot 70. The tab 68 may engage a side wall of the slot 70 to prevent the retainer tube 44 from being pulled out of the connector body 24. The illustrated embodiments of the position feature and the tube lock include cooperating features on the retainer tube 44 and the terminal interface 32. However, it should be appreciated that these features may be included on other components of the electric connector 22, if desired.

The principle and mode of operation of this invention have been explained and illustrated in its preferred embodiment. However, it must be understood that this invention may be practiced otherwise than as specifically explained and illustrated without departing from its spirit or scope.

What is claimed is:

1. An electric connector comprising:
a connector body;
a terminal mounted to the connector body;
a wire connected to the terminal and including a conductive portion having a non-exposed portion that is surrounded by a wire insulation and an exposed portion that is not surrounded by the wire insulation; and
a retainer tube mounted to the connector body and engaged with the wire, wherein the retainer tube generally surrounds the exposed portion of the conductive portion of the wire.

2. The electric connector of claim 1, wherein the retainer tube is made of non-electrically conductive material.

3. The electric connector of claim 1, further comprising: a space defined between the connector body, the wire, and the retainer tube; and a seal located within the space.

4. The electric connector of claim 1, further comprising a tube lock which retains the retainer tube in position relative to the connector body.

5. The electric connector of claim 1, wherein the retainer tube includes retainer beams that extend from the retainer tube toward a retainer tube axis and engage the wire.

6. The electric connector of claim 1, wherein the retainer beams extend from a first end of the retainer tube toward a second end of the retainer tube.

7. The electric connector of claim 1, wherein the wire extends through a wire opening defined by the connector body, and wherein the retainer tube is located within the wire opening.

8. The electric connector of claim 7, wherein the retainer tube includes retainer beams that engage the wire, and wherein the retainer beams define an inner diameter when not engaging the wire.

9. The electric connector of claim 8, wherein the wire has a diameter that is larger than the inner diameter.

10. The electric connector of claim 8, wherein the retainer beams apply a force to keep the wire coaxial with the wire opening.

11. The electric connector of claim 8, wherein the retainer beams extend from the retainer tube toward a retainer tube axis that is coaxial with the wire opening.

12. The electric connector of claim 11, wherein the retainer beams extend from a first end of the retainer tube toward a second end of the retainer tube.

13. The electric connector of claim 1, further comprising a position feature that blocks the retainer tube from being connected to the connector body in an improper position.

14. The electric connector of claim 13, wherein the position feature comprises cooperating features on the retainer tube and the connector body.

15. An electric connector comprising:

a connector body;

a terminal mounted to the connector body;

a wire connected to the terminal;

a retainer tube mounted to the connector body and engaged with the wire, wherein a space is defined between the connector body, the wire, and the retainer tube; and a seal located within the space.

16. The electric connector of claim 15, wherein the wire includes a wire insulation and an exposed portion where a conductive portion is not surrounded by the wire insulation, and wherein the retainer tube generally surrounds the exposed portion.

17. The electric connector of claim 15, wherein the retainer tube is made of non-electrically conductive material.

18. The electric connector of claim 15, further comprising a tube lock which retains the retainer tube in position relative to the connector body.

19. The electric connector of claim 15, wherein the retainer tube includes retainer beams that extend from the retainer tube toward a retainer tube axis and engage the wire.

20. The electric connector of claim 15, wherein the retainer beams extend from a first end of the retainer tube toward a second end of the retainer tube.

21. The electric connector of claim 15, wherein the wire extends through a wire opening defined by the connector body, and wherein the retainer tube is located within the wire opening.

22. The electric connector of claim 21, wherein the retainer tube includes retainer beams that engage the wire, and wherein the retainer beams define an inner diameter when not engaging the wire.

23. The electric connector of claim 22, wherein the wire has a diameter that is larger than the inner diameter.

24. The electric connector of claim 22, wherein the retainer beams apply a force to keep the wire coaxial with the wire opening.

25. The electric connector of claim 22, wherein the retainer beams extend from the retainer tube toward a retainer tube axis that is coaxial with the wire opening.

26. The electric connector of claim 25, wherein the retainer beams extend from a first end of the retainer tube toward a second end of the retainer tube.

27. The electric connector of claim 15, further comprising a position feature that blocks the retainer tube from being connected to the connector body in an improper position.

28. The electric connector of claim 27, wherein the position feature comprises cooperating features on the retainer tube and the connector body.

* * * * *